(12) United States Patent
Mirho

(10) Patent No.: US 9,540,809 B1
(45) Date of Patent: Jan. 10, 2017

(54) MODULAR COMPONENTS FOR RECONFIGURABLE AND SELF-VALIDATING ATHLETIC STRUCTURES

(71) Applicant: Maxwell C Mirho, Gold Beach, OR (US)

(72) Inventor: Maxwell C Mirho, Gold Beach, OR (US)

( * ) Notice: Subject to any disclaimer, the term of this patent is extended or adjusted under 35 U.S.C. 154(b) by 676 days.

(21) Appl. No.: 14/050,204

(22) Filed: Oct. 9, 2013

(51) Int. Cl.
*E04C 1/00* (2006.01)
*E04H 3/10* (2006.01)

(52) U.S. Cl.
CPC .. *E04C 1/00* (2013.01); *E04H 3/10* (2013.01)

(58) Field of Classification Search
CPC .............. Y10T 403/58; Y10T 403/581; Y10T 403/593; F16B 2001/0064; F16B 21/12; F16B 21/183; F16B 2021/14
USPC ...... 174/535, 541; 52/582.1, 588.1; 220/1.5, 220/32.2, 23.4; 206/503, 504, 509, 511, 512, 206/821
See application file for complete search history.

(56) References Cited

U.S. PATENT DOCUMENTS

| | | | | |
|---|---|---|---|---|
| 4,695,184 | A * | 9/1987 | Robishaw | B60P 7/13 114/249 |
| 8,596,900 | B2 * | 12/2013 | Diener | F16C 11/0652 403/115 |
| 2009/0251035 | A1 * | 10/2009 | Cash | A47B 47/042 312/265.5 |
| 2010/0043309 | A1 * | 2/2010 | Martin | E03C 1/01 52/79.5 |
| 2011/0148216 | A1 * | 6/2011 | McCoy | H02J 7/025 307/104 |
| 2012/0076570 | A1 * | 3/2012 | Mekid | F16C 41/001 403/104 |
| 2014/0178171 | A1 * | 6/2014 | Herold | B65D 90/00 414/802 |
| 2015/0300006 | A1 * | 10/2015 | Lanese | E04B 2/06 52/585.1 |
| 2015/0300008 | A1 * | 10/2015 | Gosling | E04C 2/288 52/506.05 |

* cited by examiner

*Primary Examiner* — Jonathan Masinick
(74) *Attorney, Agent, or Firm* — FSP LLC

(57) ABSTRACT

A modular construction system includes a first component having multiple faces arranged into a three dimensional structure, each face having receptacles. The system includes a second component having posts formed to fit within the receptacles. Electrical contacts on each post propagate electrical signals to analytical logic that determines if each post has made electrical contact with a corresponding receptacle. Each post also includes an expansive element to create mechanical engagement with the corresponding receptacle. The analytical logic generates a signal external to the second component indicative of the mechanical engagement.

10 Claims, 4 Drawing Sheets

MODULAR COMPONENTS FOR RECONFIGURABLE AND SELF-VALIDATING ATHLETIC STRUCTURES

BACKGROUND

Conventional structures for use in athletics suffer from several shortcomings. These include being difficult to reconfigure, being subject to unstable configuration, and being difficult to continuously monitor for safety. There is a long-felt need for structures that address these shortcomings.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic may vary according to implementation.

DESCRIPTION

A modular construction system includes components which may be assembled to form a customized framework. The components may be constructed, for example, from strong plastic or aluminum parts, which are cast or molded. Certain ones of the components may be cubes, or rectangles, or parallelograms, or even other multi-sided three dimensional shapes, such as 3D structures with triangular, pentagonal, hexagonal or octagonal faces. In the embodiment described herein for purposes of illustration and description, cubes constructed from high-strength ABS plastic are described. Each cube is symmetrical so that every face of the cube has the same dimensions and the same features as every other face.

Figure 1A:
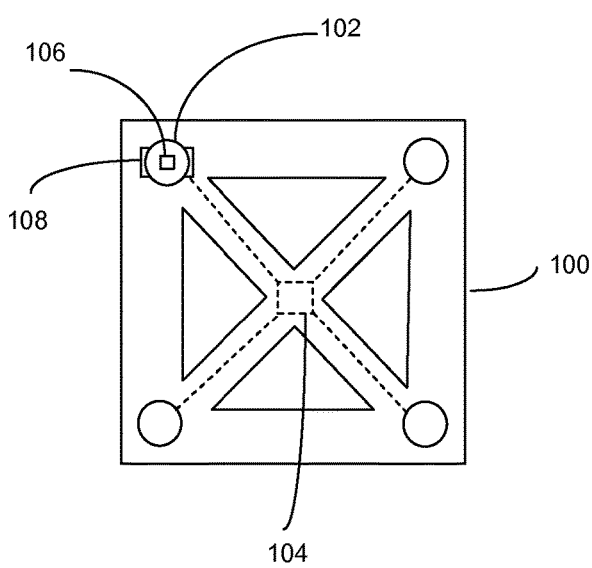
FIGS. 1A-1B illustrate an embodiment of a hub component of a modular structure.
Figure 1B:
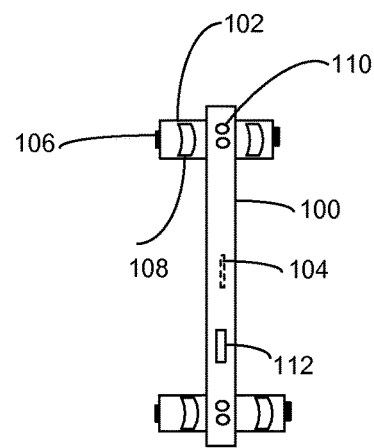
Figures 2A, 2B, 2C:
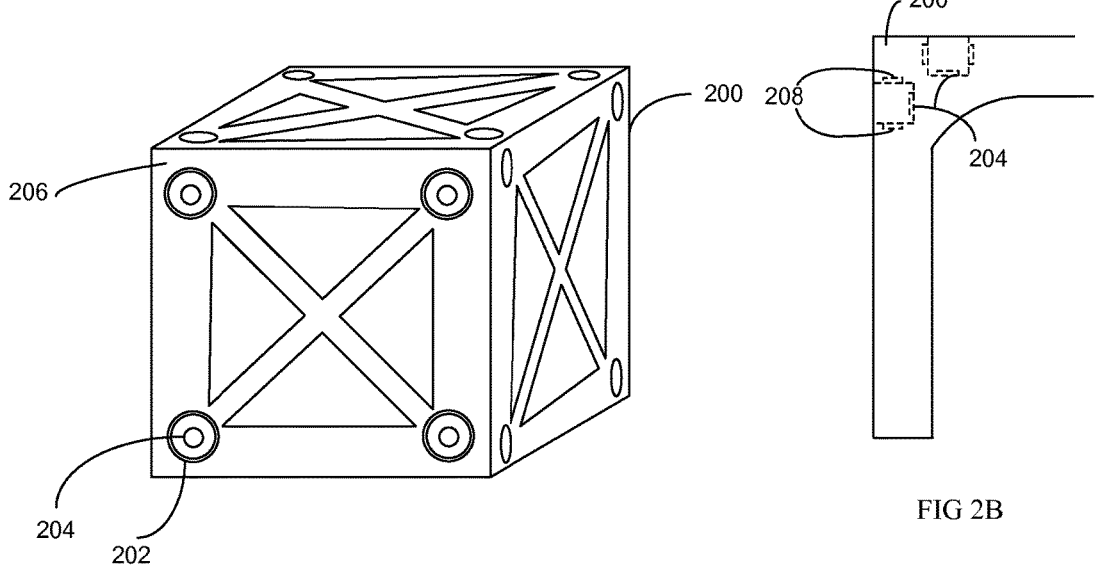
FIGS. 2A-2C illustrate an embodiment of a hub retaining component of a modular structure.
Figure 3:
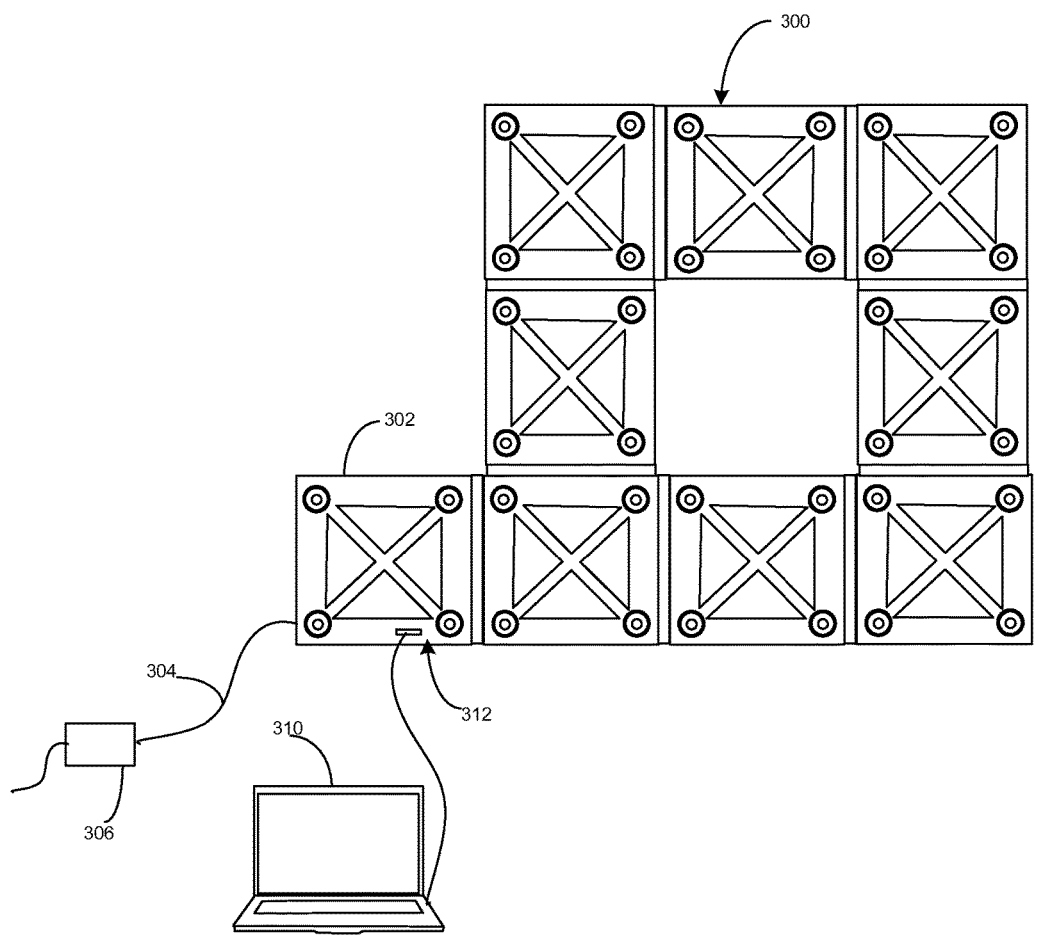
FIG. 3 illustrates an embodiment of a modular structure.

Each face of the exemplary cube component 200 includes four receptors 202, each located nearest a different corner 206 of the face. Each receptor 202 is identical, and is formed to receive a post 102 from a connecting hub component 100. Within each receptor are electrical connections as illustrated in FIGS. 2A-2C. A first electrical connection 204 is located at a bottom depth of the receptor and second electrical connections 208 are located along a side of each receptor. The electrical connection 204 at the bottom depth of each receptor 202 electrically engages an electrical contact 106 on an end face of a post 102 on a connecting hub 100. This provides an initial source power to the electrically expansive element 108 that is located along sides of the post 102. The expansive element 108, when powered, expands into the sides of the receptors 204, engaging the side electrical contacts 208 of the receptor 202 with side contacts 108 of the posts 102. A robust and redundant electrical and mechanical connection is thus made between a component cube 200 and a connecting hub 100 at each of four corners of the cube 200.

One or more cube components 302 may be constructed differently from the others, being configured to receive utility power via an electrical cord 304. The power may be received through an interruptible power supply 306 which in return is engaged with utility power, such as AC power, at 110 volts and 60 Hertz. (North America). The AC power is received by this "power cube" 302 and converted to DC power (direct current power) suitable for powering digital logic components. The cubes themselves may not include logic components, but may instead primarily act as conductors of electrical power to and mounting structures for the hubs.

Each hub 100 includes logic 104 to identify which of its posts 102 are engaged (either mechanically or electrically) to a corresponding receptacle 202. This can be done a number of ways, for example by detecting electrical power through each contact 108 of the post 102, or by detecting mechanical pressure on each contact 108 of the post 102. Each hub 100 furthering includes logic 104 to communicate which of its posts 102 are engaged with receptacles 202 of a cube externally, to a central analytic device 210 (laptop computer, personal computer, smartphone, etc.), which analyzes received information from the hubs to ascertain a stability of the framework 300. For example, some posts 102 may not be firmly engaged with a receptacle 202, and those would cause an indication of instability at those points in the structure.

The contacts 108 include or are part of an electrically expansive element (e.g., solenoid, piezo crystal, electromagnetic actuator) that is initially energized by contact between contact 106 of post 102 and contact 204 of receptor 202.

In one embodiment, each hub 100 further comprises logic 104 including a unique identity for the hub 100 in the framework, and logic 104 to communicate that unique identity externally from the hub 100 (e.g., via one or more electrical contact 108 of its posts 102, wirelessly, etc.), and further includes logic 104 to receive the unique identity of hubs that are neighbors/adjacent, meaning connected to and powered from a same cube 200 that the hub 100 is connected to. This information about which hubs are neighbors/adjacent may be communicated to an analyzer component 310, which can then determine the layout of the structure 300 and analyze the structure 300 for stability based on how it is arranged, and (optionally) how it will be used. Connectivity information may be communicated wirelessly, or over the electrical connection back to the power cube 302, or to any external data port 312 of any hub or cube (e.g., USB). If communication is over power conductors, it may be implemented using a modulated high frequency signal wave that does not introduce significant noise to the power supply. Lights 110 (e.g., LEDS) on each side of each hub 100 may change state to indicate secure connectivity between an associated post 102 and receptor 202.

To facilitate analysis of the final structure, logic 104 may comprise one or more three-axis magnetometer. The magnetometer may provide a reference for determining the hubs orientation along the x-, y-, and z-axes. A magnetometer may comprise amorphous magnetic alloys whose resistances change when acted upon by the planet's magnetic field. Some magnetometers may utilize the Hall effect, in which electrons through a conductor in the presence of a magnetic field are forced to one edge of the conductor, creating a voltage difference whose orientation is perpendicular to the magnetic field.

By way of example, the following machine procedure description may be adapted into various program languages and compiled into a control signal sequence that determines the connectivity of a modular structure utilizing components described herein.

```
try {
testConnections(start_hub);
} catch (err) {
output (err);
}
testConnections(hub) {
if (not hub) then return;
neighbors[ ]=getNeighbors(hub);
for (each neighbor in neighbors) {
a. if (hub.badConnection(neighbor) then throw (Bad connection between
   i. "+hub.name+" and "+neighbor.name);
b. testConnections(neighbor);
}
}
```

A bad connection is reported for a hub if less than all of its posts are not reported as engaged with a corresponding receptacle. A similar process may be used to scan the hubs for their neighbors and orientations to ascertain the 3D physical layout of the structure. Those skilled in the art will recognize appropriate modifications to the pseudocode above to prevent backtracking and infinite recursion to components already scanned.

Figure 4:
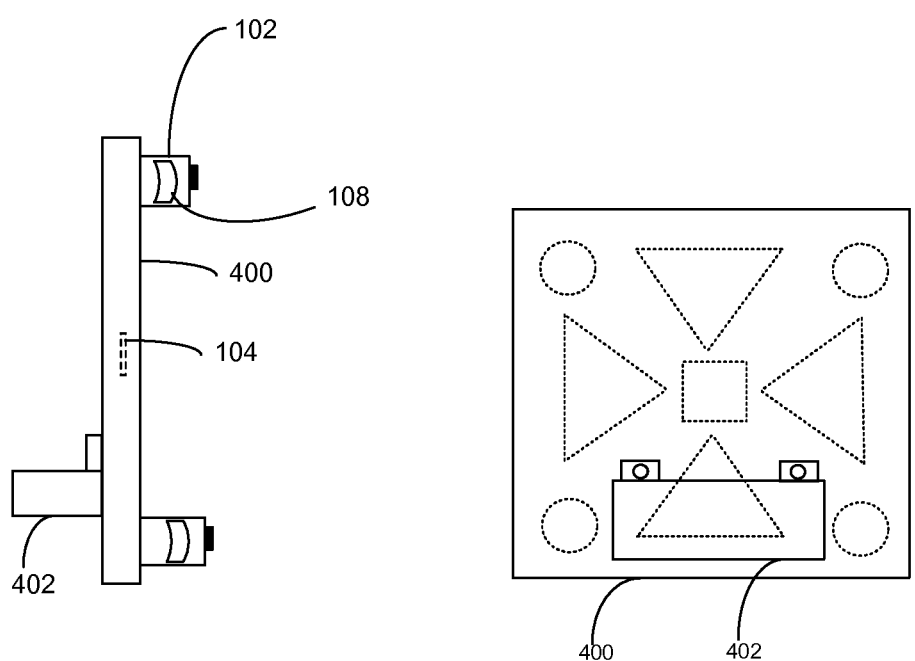
FIG. 4 illustrates an embodiment of a facing component of a modular structure.

In one embodiment, the receptors 202 of a cube 200 not only receive hubs 100, they can also receive a facing component (FIG. 4, 400) that can include interactive objects. The interactive objects 602 may include hand holds, foot placements, etc. Facing components 400 can include posts 102 which are identical to the posts used by the hubs 100, and also may include logic 104 such as in the hubs 100, to identify connectivity and engagement with the receptacles 202.

Solenoids, electromagnetic actuators, piezoelectric actuators, or other electrically expansive elements 108 can be utilized on the posts 102.

In all embodiments, the expansive elements 108 may alternately be located on the inside of the receptors 202, instead of on the posts 102. The components described herein enable construction of dynamic and reconfigurable structures which may be automatically fused and analyzed for structural stability, and which may be faced with reconfigurable facing and features for athletic practice and performance.

A modular construction system for structures may thus include first components having multiple faces arranged into a three dimensional structure, each face having receptacles that include at least one electrical contact, and second components having posts formed to fit within the receptacles, each post comprising an electrical contact positioned to electrically interface with the electrical contact in a corresponding receptacle when each post is inserted into the corresponding receptacle. Each electrical contact on each post is configured to propagate electrical signals from the post to analytical logic of the second component. The analytical logic determines if each post has made electrical contact with a corresponding receptacle. Each post has an expansive element configured to expand under electrical excitation to create mechanical engagement with the corresponding receptacle. The analytical logic of the second component generates a signal external to the second component indicative of the mechanical engagement.

The second component may also generate a signal external to the second component identifying each other immediate neighbor second component. In one embodiment only, the second component has exactly two faces, each face with at least three posts. (Note: A face is distinguished from an edge, in that the face has a broader surface area and includes posts). In one embodiment only, each face of the second component has at least four posts arranged at the corners of a parallelogram. In one embodiment only, each face of the second component has exactly three posts arranged at the corner of a triangle. This may be useful for creating structures having angles. In one embodiment only, each face of the second component has a parallelogram shape. In one embodiment only, each face of the second component has a square shape.

The expansive element may be implemented using at least one of an electromagnet, a solenoid, or a piezoelectric material, to name some possibilities. Any material or device that expands under the influence of an electrical excitation may be utilized.

The system may include third components each having a single face comprising posts to engage with the second component on a first side of the (single) face, and having at least one handhold or foothold mounting interface on a second side of the (single) face. The system may include an analytical component, such as a laptop computer or handheld data processing machine, configured to analyze signals received from the second components, and to form a structural model of the second components, and to analyze the structural model for structural integrity based on a use model.

Implementations and Alternatives

The techniques and procedures described herein may be implemented via logic distributed in one or more computing devices. The particular distribution and choice of logic may vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A modular construction system for structures, comprising:
   a first component having multiple faces arranged into a three dimensional structure, each face comprising a plurality of receptacles, each receptacle including at least one electrical contact; and
   a second component comprising a plurality of posts formed to fit within the plurality of receptacles on the first component, each post comprising an electrical contact positioned to electrically interface with the electrical contact in a corresponding receptacle when each post is inserted into the corresponding receptacle;
   each electrical contact on each post configured to propagate electrical signals from the post to analytical logic of the second component, the analytical logic to determine if each post has made electrical contact with a corresponding receptacle;
   each post further comprising an expansive element configured to expand under electrical excitation to create mechanical engagement with the corresponding receptacle;

the analytical logic of the second component configured to generate a signal external to the second component indicative of the mechanical engagement.

2. The system of claim 1, the second component further comprising logic to generate a signal external to the second component identifying each other second component that is an immediate neighbor of the second component on the multiple faces of the three dimensional structure.

3. The system of claim 1, each second component comprising exactly two faces comprising posts, each of the two faces comprising at least three posts.

4. The system of claim 3, each of the two faces of the second component comprising at least four posts arranged in a parallelogram.

5. The system of claim 3, each face of the second component comprising exactly three posts arranged in a triangle.

6. The system of claim 3, each of the two faces of the second component having a parallelogram shape.

7. The system of claim 3, each of the two faces of the second component having a square shape.

8. The system of claim 1, the expansive element comprising at least one of an electromagnet, a solenoid, or a piezoelectric material.

9. The system of claim 1, further comprising:
a third component comprising a first face with posts to engage with the second component; and
further comprising at least one handhold or foothold mounting interface on a second face.

10. The system of claim 1, comprising:
an analytical component configured to analyze signals received from a plurality of the second components, and to form a structural model of the second components, and to analyze the structural model for structural integrity based on a use model.

* * * * *